United States Patent [19]

Mendenhall et al.

[11] Patent Number: 5,424,596
[45] Date of Patent: Jun. 13, 1995

[54] ACTIVATED STRUCTURE

[75] Inventors: Todd L. Mendenhall, Redondo Beach; Raymund A. Manning, Long Beach; Allen J. Bronowicki, Laguna Niguel, all of Calif.

[73] Assignee: TRW Inc., Redondo Beach, Calif.

[21] Appl. No.: 957,204

[22] Filed: Oct. 5, 1992

[51] Int. Cl.$^6$ .............................................. H01L 41/08
[52] U.S. Cl. ..................... 310/328; 310/330; 310/331; 310/316; 310/317
[58] Field of Search ............ 310/311, 316, 317, 319, 310/321, 328, 330–333

[56] References Cited

U.S. PATENT DOCUMENTS

| | | | |
|---|---|---|---|
| 2,478,223 | 8/1949 | Argabrite | 310/330 X |
| 3,355,603 | 11/1967 | Hesse et al. | 310/330 X |
| 4,349,762 | 9/1982 | Kitamura et al. | 310/332 |
| 4,363,993 | 12/1982 | Nishigaki et al. | 310/332 |
| 4,523,120 | 6/1985 | Assard et al. | 310/328 X |
| 4,811,246 | 3/1989 | Fitzgerald, Jr. et al. | 364/550 |
| 4,849,668 | 7/1989 | Crawley et al. | 310/328 |
| 4,868,447 | 9/1989 | Lee et al. | 310/328 |
| 4,869,768 | 9/1989 | Zola | 156/245 |
| 4,871,938 | 10/1989 | Elings et al. | 310/328 |
| 4,876,776 | 10/1989 | Whatmore et al. | 29/25.35 |
| 4,922,096 | 5/1990 | Brennan | 244/3.16 |
| 4,958,100 | 9/1990 | Crawley et al. | 310/328 |
| 4,961,627 | 10/1990 | Swain et al. | 350/319 |
| 5,010,773 | 4/1991 | Lorenz et al. | 310/319 X |
| 5,016,333 | 5/1991 | Payne et al. | 29/25.35 |
| 5,043,621 | 8/1991 | Culp | 310/316 |
| 5,081,391 | 1/1992 | Owen | 310/334 |
| 5,126,615 | 6/1992 | Takeuchi et al. | 310/330 |
| 5,136,201 | 8/1992 | Culp | 310/328 |
| 5,166,571 | 11/1992 | Konno et al. | 310/333 |
| 5,170,089 | 12/1992 | Fulton | 310/328 |
| 5,173,605 | 12/1992 | Hayes et al. | 310/332 X |
| 5,182,484 | 1/1993 | Culp | 310/328 |
| 5,198,715 | 3/1993 | Elings et al. | 310/328 |
| 5,241,235 | 8/1993 | Culp | 310/328 |

FOREIGN PATENT DOCUMENTS

| | | |
|---|---|---|
| 8803001 | 9/1988 | European Pat. Off. . |
| 90312289 | 11/1990 | European Pat. Off. . |
| 9101060 | 2/1991 | European Pat. Off. . |
| 92109140 | 5/1992 | European Pat. Off. . |
| 0044787 | 2/1990 | Japan ................................. 310/32 |

OTHER PUBLICATIONS

Japanese Patent Abstract, Publication No. JP62106314, May 16, 1987.
Japanese Patent Abstract, Publication No. JP58048482, Mar. 22, 1983.
Electronic Daming of Orthogonal Bending Modes in a Cylindrical Mast-Experiment, written by Robert L. Forward (1981).
Piezoelectric Actuators as Elements of Intelligent Structures, written by Edward F. Crawley, et al. (May 1986).
Feasibility Analysis of Piezoelectric Devices, written by Edward F. Crawley, et al. (Jan. 1988).
A Hierarchical Control Architecture for Large Flexible Structures, written by Benjamin Abbot Ward, et al. (Aug. 1985).

*Primary Examiner*—Mark O. Budd

[57] ABSTRACT

A structure includes a foundation member and multiple piezoelectric actuator/sensor elements disposed transversely about the structure. The elements are bound to the face of the foundation member to permit force transmission between the elements and the foundation member. The elements include restriction plies orientated oppositely for alternating transverse elements. The elements have a preferred direction of motion and when two adjacent elements are oppositely poled, this relates to a torsional motion between the elements and the foundation member. When four elements are spaced about a cylindrical foundation member and selectively poled, axial, bending and torsional motion between the elements and foundation member is effected.

57 Claims, 8 Drawing Sheets

| CASE \ ACTUATOR | 1 | 2 | 3 | 4 | 5 | 6 | 7 | 8 | MOVEMENT DESCRIPTION |
|---|---|---|---|---|---|---|---|---|---|
| 1 | + | + | + | + | + | + | + | + | AXIAL EXTENSION |
| 2 | − | − | − | − | − | − | − | − | AXIAL COMPRESSION |
| 3 | + | + |   |   | − | − |   |   | BENDING 1 (+) |
| 4 | − | − |   |   | + | + |   |   | BENDING 1 (−) |
| 5 |   |   | + | + |   |   | − | − | BENDING 2 (+) |
| 6 |   |   | − | − |   |   | + | + | BENDING 2 (−) |
| 7 | + | − | + | − | + | − | + | − | TORSION (+) |
| 8 | − | + | − | + | − | + | − | + | TORSION (−) |
FIG. 7
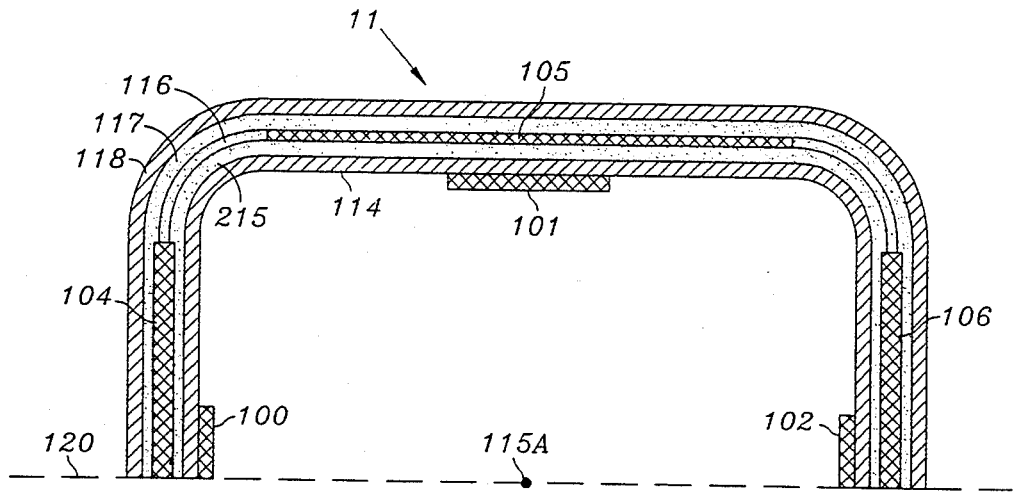
FIG. 9
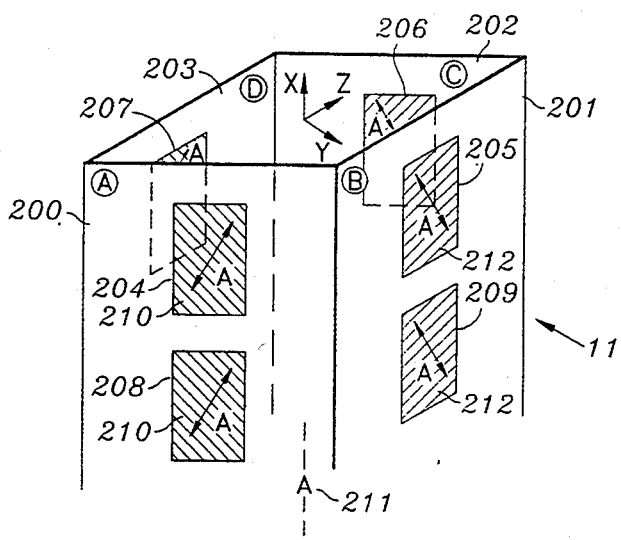
FIG. 10
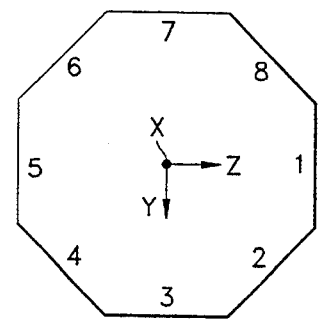
FIG. 11

ACTIVATED STRUCTURE

BACKGROUND

Active structural members for precision control of components, for instance in aerospace, is an increasing vital need. It is particularly valuable to be able to control motion and vibration caused by forces directed in at least three different senses.

This invention relates to controlling the shape and vibration of structural components in applications, for instance, in spacecraft. Other uses of such structures, which may be termed "intelligent structures," would be in robotics where precise diminutive control is necessary. More particularly, the invention relates to piezoelectric elements which are actuators and sensors embedded or attached to structures particularly fabricated from composites. As such, the movement of these structures can be actively and remotely controlled to a very precise degree.

Composite structures can have embedded piezoelectric actuators and sensors. Strain forces between the embedded piezoelectric elements and the foundation member forming the structure can be transmitted relatively between the elements and the member.

The actuators and sensors can work cooperatively whereby forces from a sensor can cause an actuator to develop counteractive forces. In this manner, when the piezoelectric element constitutes an actuator, selected forces can be transmitted to the foundation member to effect movement of the foundation member. Alternatively, when the foundation member moves, forces from the foundation member can be selectively transmitted to a piezoelectric element which constitutes a sensor. Electronic controls between actuators and sensors can finely monitor and control the movement and shape of the foundation member operative with such piezoelectric elements. An example of such actuator and sensor operation with a foundation member is U.S. Pat. No. 5,022,272 of Bronowicki et al., the contents of which are incorporated by reference herein.

Composite structures are light in weight and are not able to easily dissipate mechanical energy in the form of vibration. As they are also relatively stiff, they are particularly useful in aerospace applications. Using piezoelectric elements embedded with the composite structure is an effective way for actuating and damping movements of the structure. Damping can be applied to compensate for vibrational or other loading forces on the structures.

When piezoelectric elements are bound into a composite structure, movement between the foundation member and the piezoelectric elements in the longitudinal and transverse direction are transmitted between the foundation member and the piezoelectric elements. In this manner, the axial extension or compression of the foundation member can be controlled in the longitudinal direction and the bending of the foundation member can be controlled in a transverse direction.

This degree of control is, however, relatively limited since it is only in the two motive senses, namely axial and bending. In many cases, the foundation member needs control in a third sense of movement, namely torsion. The ability to have an activated structure with a foundation member responsive additionally to torsional forces is not possible with known systems. This drawback is significant.

In aerospace applications, it is not possible to sense or actuate a torsional stress imported to an elongated arm or boom that supports, for example, a remote solar array panel from a main space body. Other applications also require precise control of movement of components, for instance in microtechnology generally, namely in micromechanical applications.

There is an overall vital need to dampen the vibrational movement of a foundation member when it experiences axial, bending and torsional stresses simultaneously. There is thus a need to provide an activated or intelligent structure with the ability to control movement to a degree superior to that of known structures.

SUMMARY

By this invention, there is provided a system for improved control of the movement of activated structures.

According to the invention, a structure which includes a foundation member includes a face with a longitudinal direction and a transverse direction. The foundation member can move or be moved in a longitudinal sense, a transverse sense, and in a relatively torsional sense.

Piezoelectric elements, each having a poling direction, are incorporated within the foundation member such that the elements are physically bound with the foundation member. The elements include a reactive face having a longitudinal direction and a transverse direction. The elements are located adjacent to each other and spaced relatively apart so that forces are transmitted between the foundation member and the piezoelectric elements.

At least two of the piezoelectric elements have different operative characteristics relative to each other. Each element relates differently to force in a direction along the reactive face. The effect of these different force-reaction characteristics of the element on the foundation member is related to movement of the foundation member in at least the torsional sense, whereby a torsional motion can be imparted to a foundation member.

In a preferred form of the invention, movement is also related in at least one of the longitudinal axial sense and the transverse bending sense. Selectively, movement in a shear direction relative to the longitudinal sense can also be effected.

The relationship of multiple piezoelectric elements set up in adjacency and end-to-end and side-to-side relationship with the foundation member, where at least some of the piezoelectric elements have different characteristics relative to others, provides for a controlled system whereby motion of the foundation member can be controlled in at least three different motion senses.

In a preferred form of the invention, the foundation member includes more than the one transversely directed face, and is preferably a cylinder. The cylinder is selectively regular or irregular.

In one form, the transverse faces of the foundation member are effectively constituted by multiple offset planar faces forming a polygonal structure disposed about a longitudinal axis, parallel with the longitudinal axis of the cylinder.

In other cases, the multiple faces are constituted effectively by mathematically determined "theoretical" sections of a curvilinear face. The cylinder can be solid or tubular. The torsional movement sense is related relative to the longitudinal axis of the cylinder.

In another aspect of the invention, each piezoelectric element is constituted by a first component which is an isotropic ceramic wafer, and a second anisotropic component. The isotropic component is active such that when a voltage is applied in the poling direction, this is related as equal movement in the longitudinal and transverse directions. The second component in the form of a anisotropic composite fiber is bound to the isotropic ceramic on the reactive face of the first component. Thereby, the overall piezoelectric element provides for a preferential motion at an angle related to at least one of the longitudinal or transverse directions of the piezoelectric element. Preferably, the fibers are bound at an angle which is non-parallel to either of the longitudinal or transverse directions of the piezoelectric element.

The piezoelectric elements can be considered applied as a set of at least two piezoelectric elements in relative adjacency. For the first element, the composite fiber material is applied in the first sense relative to the first component. For the adjacent piezoelectric element of the set, the composite fiber material is applied in a second sense relative to its first component, the ceramic. Thus, two piezoelectric elements of the set operate differently relative to each other. The second component composite material preferably includes a restriction ply having an orientation for the first piezoelectric element oppositely relative to an orientation of a ply for the second piezoelectric element.

Preferably, the foundation member includes at least four transverse faces, and at least one piezoelectric element is bound with each transverse face. Poling of the piezoelectric elements is selectively arranged whereby, when all the elements are poled in the same direction, axial extension or compression in a longitudinal sense is effected. When poling on one element is effected in a first direction and in an opposite element in a second direction, bending is effected. When poling of adjacent elements is oppositely effected, torsional movement is effected.

The invention is now further described with reference to the accompanying drawings.

DRAWINGS

FIG. 7 is a table illustrating different polarity combinations for the eight adjacent piezoelectric elements wherein eight degrees of movement of the foundation member is effected.

Figure 8A:
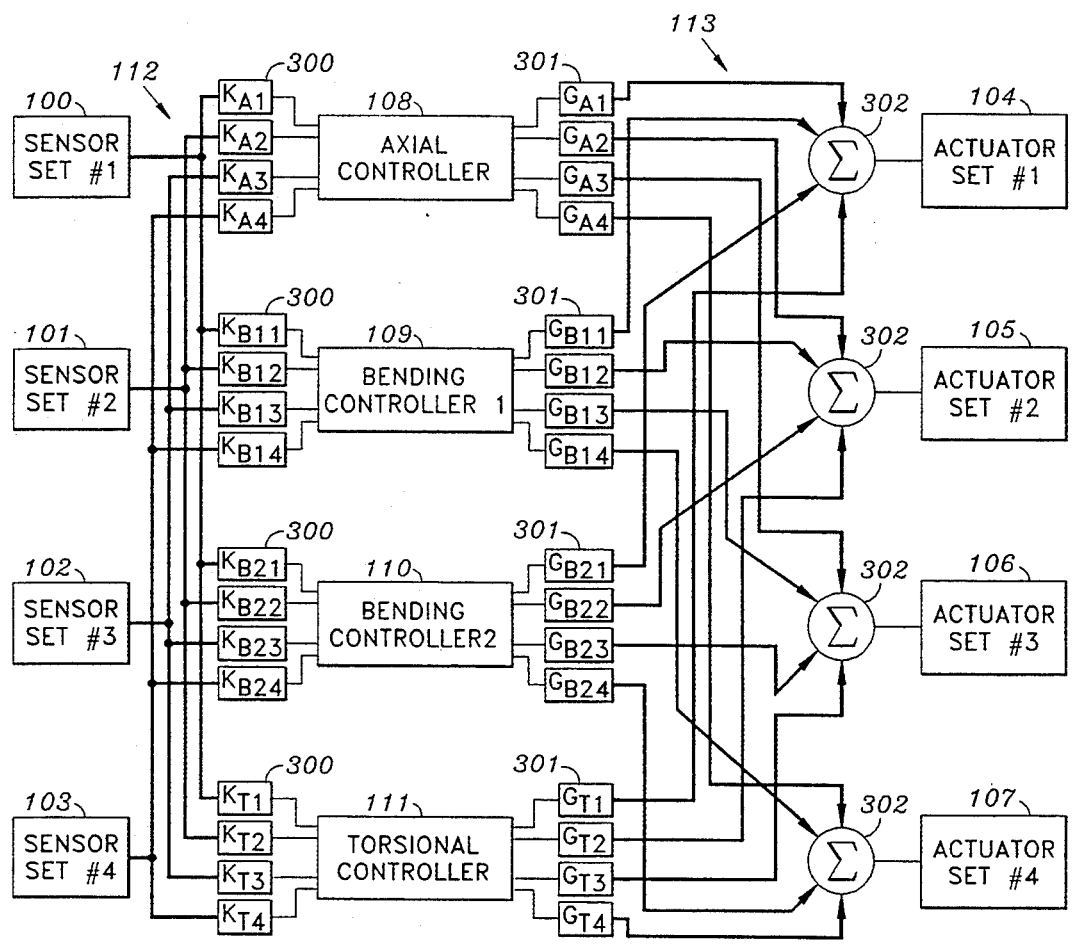
Figure 8B:
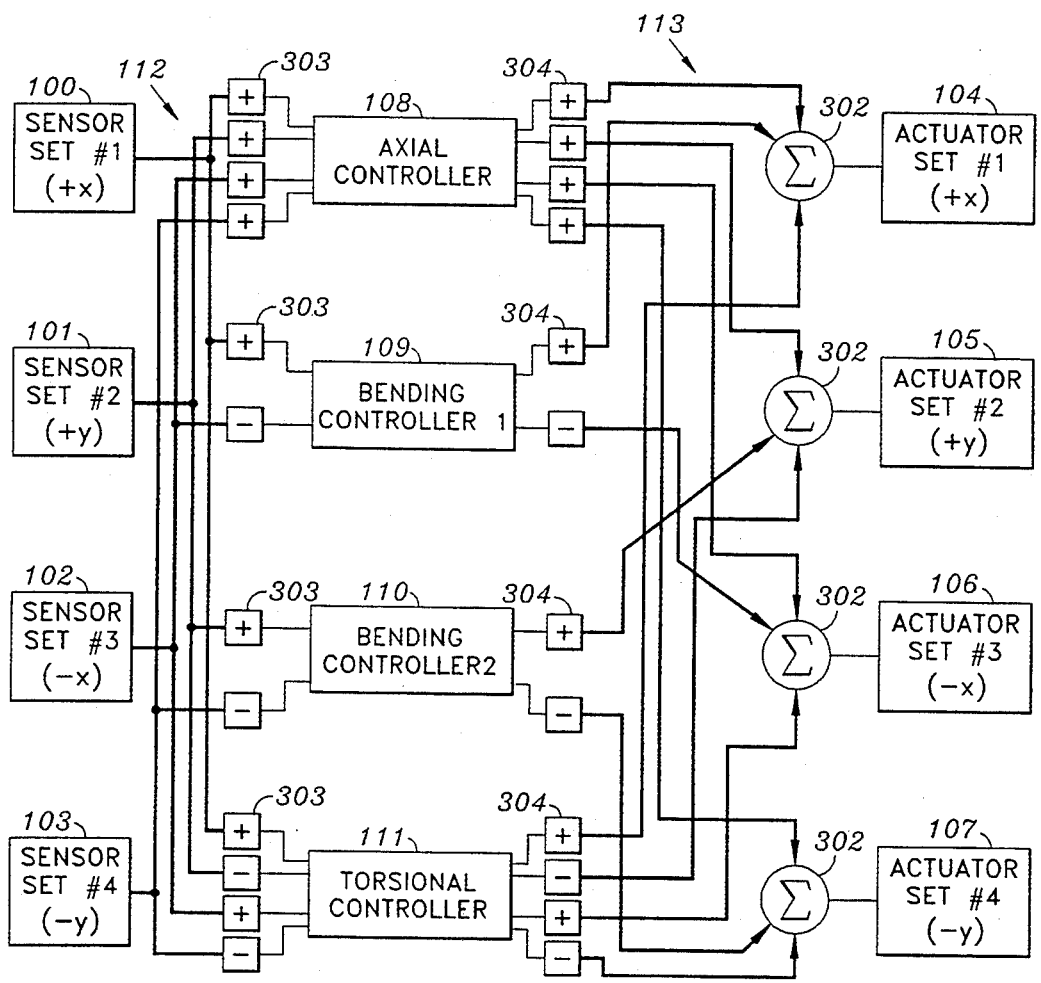
Figure 8C:
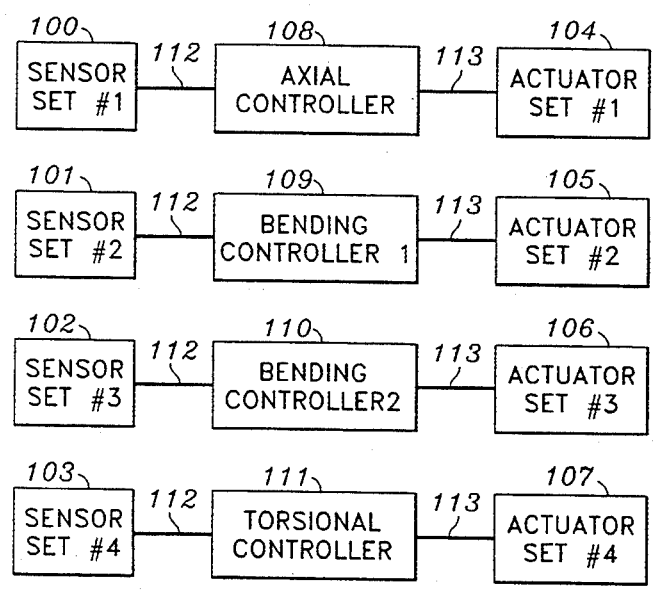

FIGS. 8A, 8B, and 8C are three different informational flow configurations for a structure having four piezoelectric actuator elements in four transverse planes, and four piezoelectric sensors in the four transverse planes. In the configurations, there are controllers between actuators and sensors so that movement can be related in the axial, bending, and torsional senses.

FIG. 9 is a cross-sectional end view illustrating a half-portion of a square strut, namely a four-sided foundation member. There are shown composite layers forming the foundation member, and piezoelectric actuators and piezoelectric sensors bound and with the foundation member which is a tube.

FIG. 10 is an isometric diagrammatic view illustrating a four-sided strut with actuators on four faces constituting the four transverse sides, and wherein there are multiple piezoelectric elements arranged in a linear relationship longitudinally.

FIG. 11 is a cross-sectional diagrammatic end view of an octagonal strut.

Figure 12A:
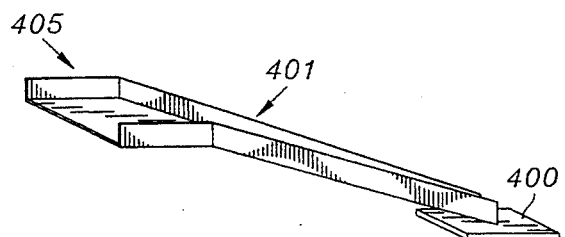
Figure 12B:
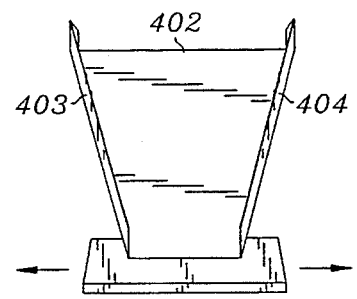
Figure 12C:
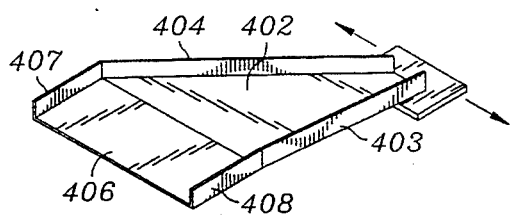
Figure 12D:
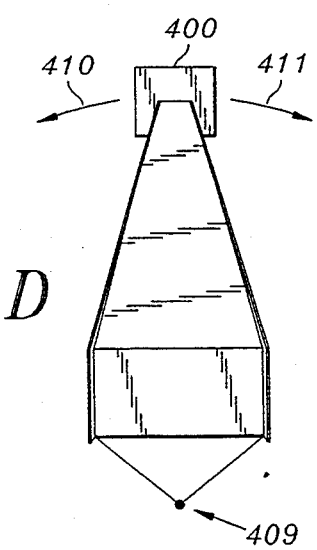
Figure 12E:
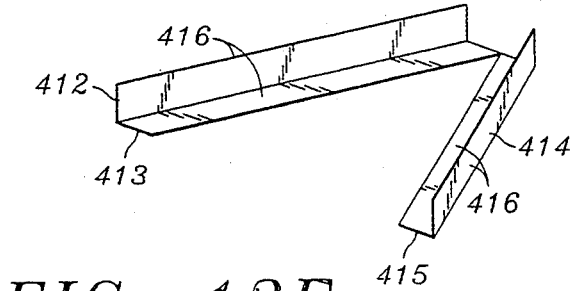
Figure 12F:
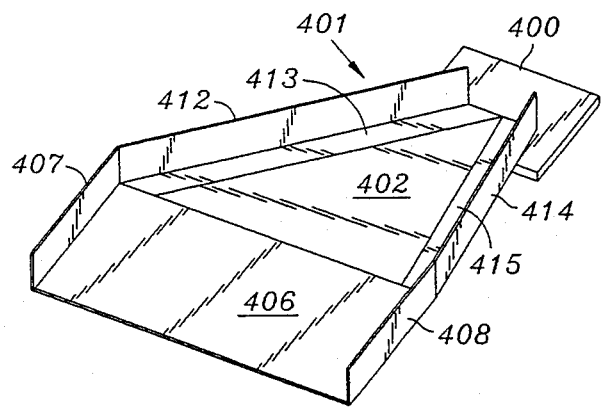

FIGS. 12A to 12F are illustrations of an application of piezoelectric elements which relate to the movement of a disk head for a hard disk data storage system, the head being the foundation member and in which FIG. 12A is a side view of the disk drive head, FIG. 12B is a front view, FIG. 12C is a perspective view from the top, FIG. 12D is a top view, FIG. 12E is an indication of actuators and sensors to be added to the support structure of the disk drive head, and FIG. 12F is a perspective view illustrating the addition of the actuators' sensors to the support structure.

Figure 13:
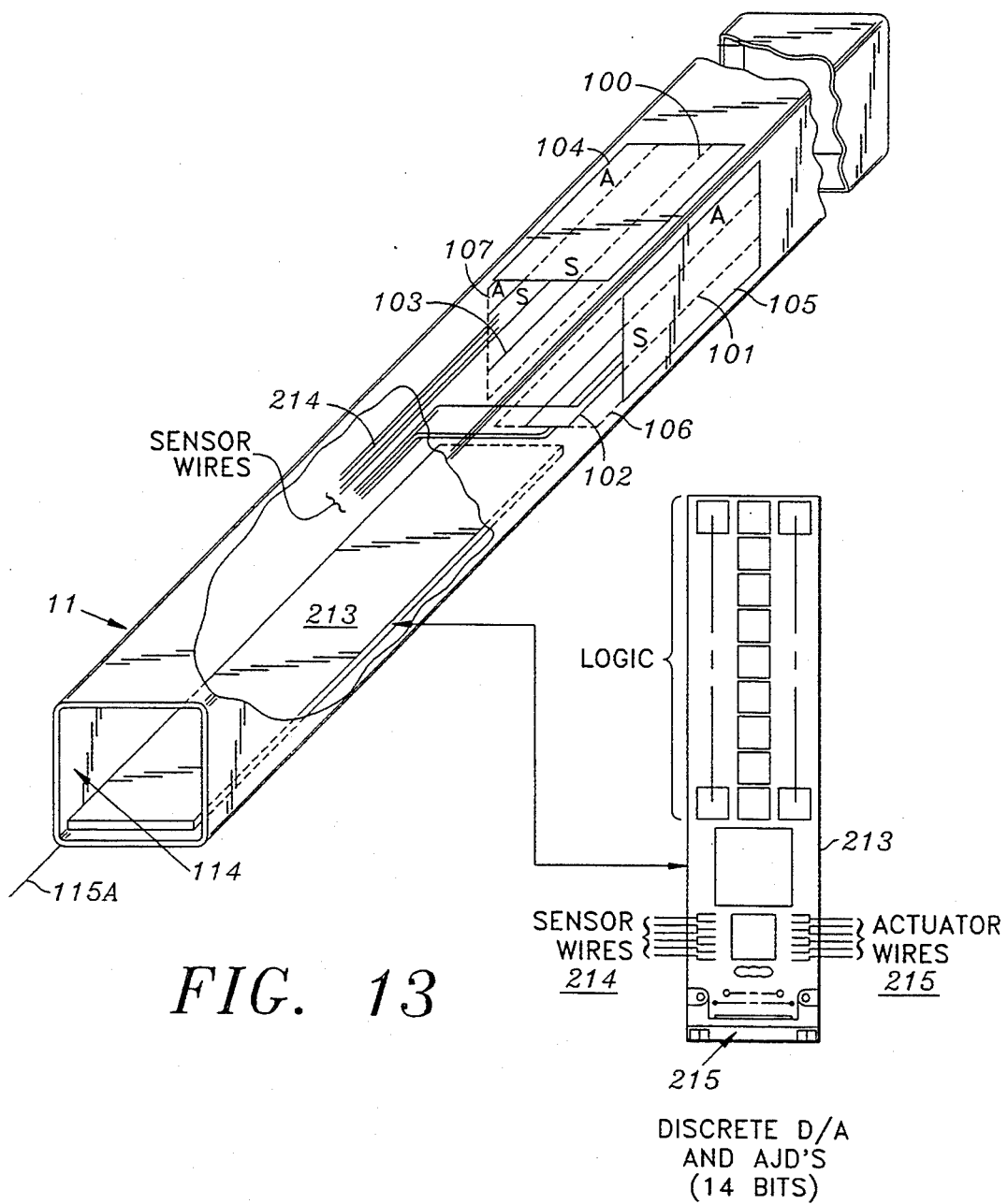

FIG. 13 is a block diagram illustrating the electronic components of a control system between the piezoelectric sensors and actuators for regulating movement of the foundation member and the interaction with the piezoelectric elements constituting the sensors and actuators.

Figure 14:
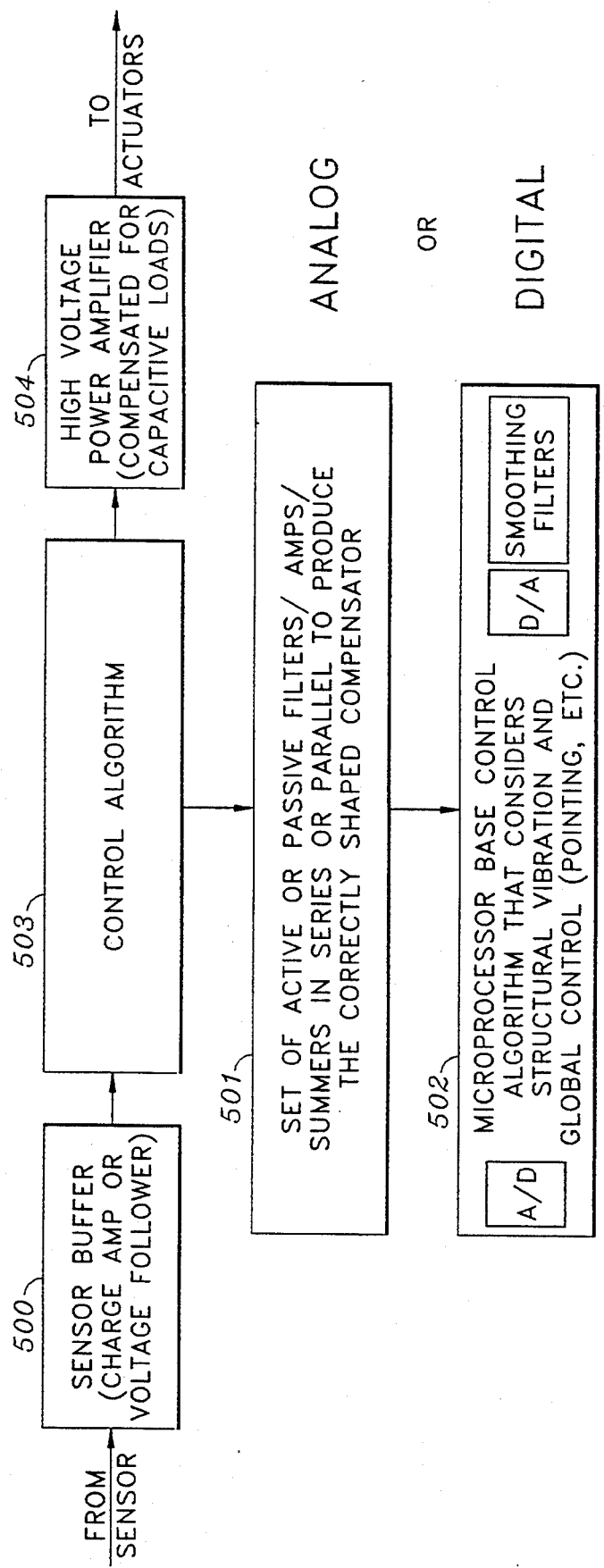

FIG. 14 is a flow diagram of the electronic controller shown in FIG. 13 for regulating the movement of the foundation member in response to the piezoelectric sensors and actuators.

DESCRIPTION

Movement Senses in Relation to an Activated Structure

Figure 1A:
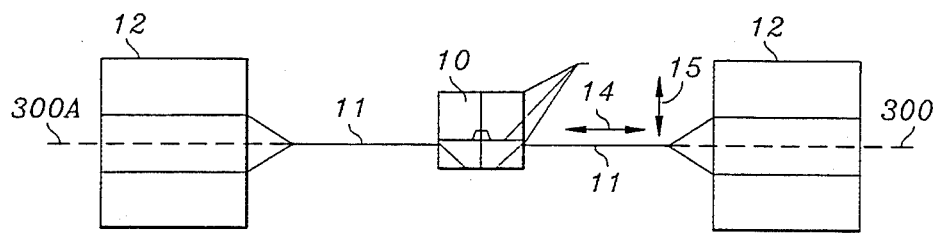
FIG. 1A is a side view illustrating a configuration of a space vehicle, boom and solar array.
Figure 1B:
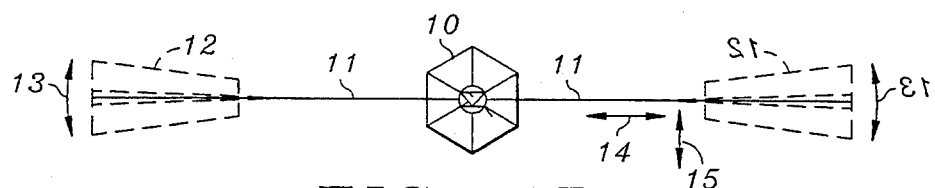
FIG. 1B is a top view of the space vehicle, boom and solar array configuration.
Figure 2:
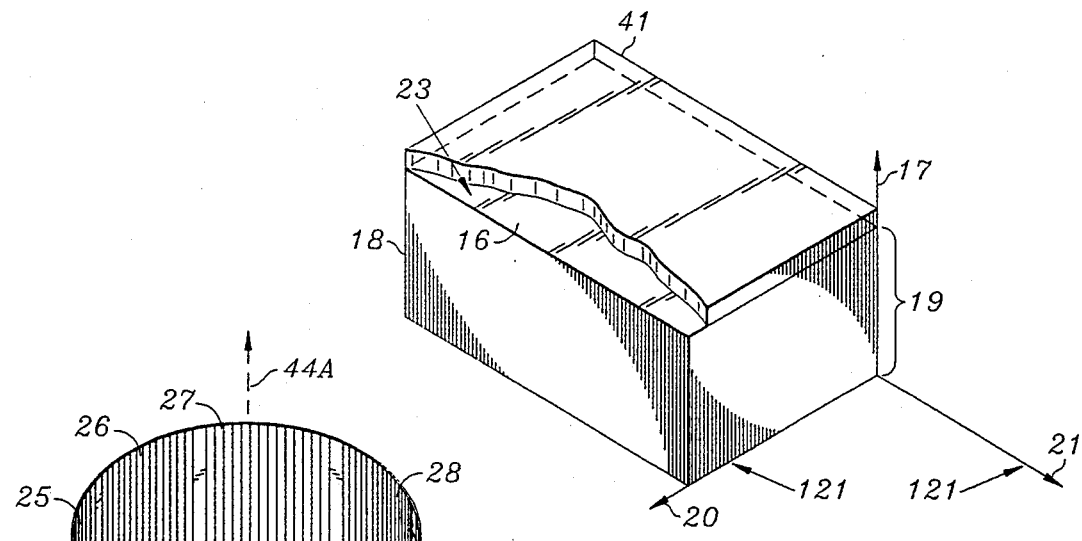
FIG. 2 is an isometric view (not to scale) illustrating a first component of a piezoelectric element showing a poling direction, the longitudinal direction and the transverse direction and portion of the second component.

In FIGS. 1A and 1B, there is illustrated a typical application for activated structures, namely as a strut or boom which is subject to axial, bending and torsional movement effects. In FIG. 1A, a main body 10 of a space vehicle is attached to solar array booms 11 which are connected to solar array panels 12. The panels 12 are likely to be subject to actuation in a torsional sense as indicated by arrows 13, an axial sense as indicated by arrows 14 and a bending sense as indicated by arrows 15.

As shown in FIGS. 1A and 1B, the bending sense can be in either of two planes, namely relatively from top to bottom or from side to side. The axial movement can be expansion or compression along the longitudinal axis 300A.

The torsional motion 13 is essentially a twisting or shear sense motion applied to the boom 11 when the panels 12 turn or twist about the longitudinal relative to the body 10 of the vehicle. Such a torsional motion 13 would arise where the panels 12 twist or turn about axis 300A relative to the axis 300A. Alternatively, the body 10 would twist or turn relatively. Torsional or shear forces are then applied to the boom 11 which is the foundation member.

By having the booms 11 as active structural members, it is possible with the invented system to regulate the motion in the torsional sense 13, axial sense 14 and the bending senses 15. As such, the active structures 11 may be used to control the shape and the vibration of the structures 11. The activated structures 11 contain multiple piezoelectric elements which include both actuators and sensor elements. Electronic control between the actuators and sensors imparts and regulates the desired movement of the structure members 11.

Piezoelectric Element

A piezoelectric element includes a ceramic material such as lead-zirconate titanate (PZT), or a electrostrictive ceramic such as lead molybdenum niobate (PMN). Such piezoelectric elements are formed as a wafer having a thin depth, namely about 0.0075 inches thick. Their longitudinal length is about 2.5 inches and transversely, their width is about 1.5 inches.

The piezoelectric element includes such a ceramic wafer as a component 16 that is isotropic and includes a poling direction 17 and a lateral direction 121 which is at right angles to the poling direction. When a voltage as indicated by 19 is applied across the depth or thickness 18, an equal strain is created in two components of the lateral direction 121, namely lateral transverse direction 20 and the lateral longitudinal direction 21. The piezoelectric component 16 includes a reactive face 23. Poling the element 16 in direction 17 would effect a contraction of the element in direction 17 and expansion equally in directions 20 and 21. Conversely, the reverse poling would cause an expansion in direction 17 and equal contraction in directions 20 and 21.

Piezoelectric Elements and Foundation Member

By embedding, attaching or bonding a piezoelectric component 16 to a foundation member which is isotropic, equal strains are generated in the directions 20 and 21 in the foundation member. In this manner, with the foundation member being longitudinally directed along the direction of line 21, an axial movement parallel to axial movement of the structure 11 as indicated along line 14 is effected. This can be compression or expansion as indicated. Similarly, a transverse bending motion 15 relative to the longitudinal axis 300A can be applied to the structure 11 which is in a direction wherein the movement along direction 20 is parallel with the movement as indicated by arrows 15.

By placing adjacent piezoelectric components 16 perpendicular to each other on two right-angular axes relative to each other, the bending motion 15 as depicted in both FIGS. 1A and 1B, namely right angularly relative to each other, can then be effected.

Working Sets of Two-Component Piezoelectric Elements

Figure 3:
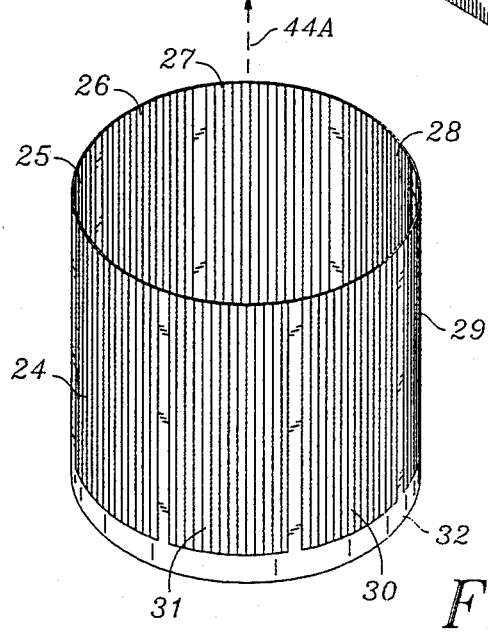
FIG. 3 is an isometric view illustrating a regular cylinder being a tube. The outer face of the tube is shown with eight transverse sections, circumferentially arranged, the tube being a foundation member for location of the piezoelectric elements in each of the eight sections.
Figure 4:
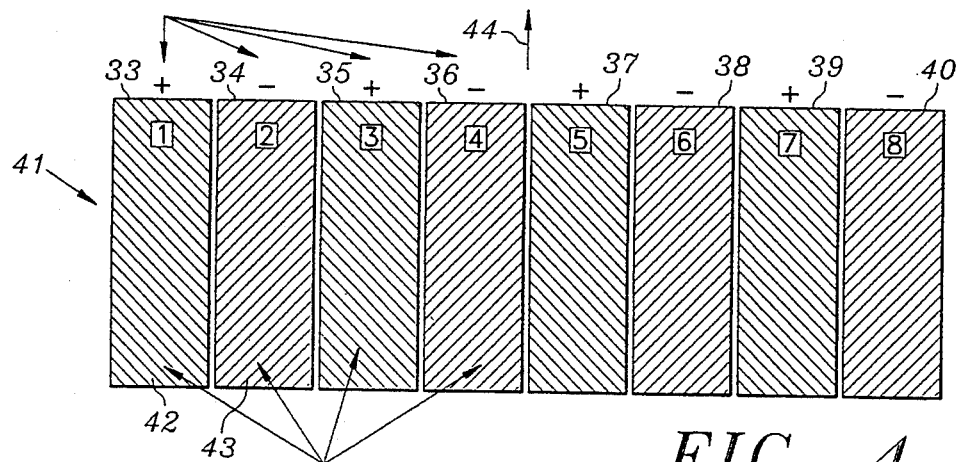
FIG. 4 is an arrangement of eight piezoelectric elements in adjacent spaced relationship rolled or developed onto a flat plane. Each of the piezoelectric elements is bound with a respective segment of the eight transverse sections of the foundation member.

FIGS. 3 and 4 illustrate a tubular regular cylinder wherein there are eight transverse sections 24, 25, 26, 27, 28, 29, 30 and 31. These sections are arranged circumferentially around the longitudinal axis 44A of the cylindrical tube body 32. In each of these transversely related sections 24 through 31, there is bound a piezoelectric element 33, 34, 35, 36, 37, 38, 39 and 40, respectively. There are two groups of elements. The group of elements 33, 35, 37 and 39 have common characteristics, and the group of elements 34, 36, 38 and 40 have common characteristics. These two respective groups of elements have different characteristics relative distinguishing the other. The characteristic of each groups is one where strains developed in the lateral directions 20 and 21 of each of these elements is different. Thus, each piezoelectric element, when poled in a direction 17 by applying a voltage, does not cause equal strain in directions 20 and 21.

The piezoelectric elements are constituted by two components, a piezo ceramic component 16 and a composite fiber component 41. In the piezoelectric elements 33, 35, 37 and 39, the fibers 41 are orientated in a first direction as indicated by lines 42. In elements 34, 36, 38 and 40, the fibers 41 are orientated in a second direction as indicated by lines 43. The composite fibers 41 apply a stiff restricting layer over each of the ceramic elements 16. The fibers 41 are orientated as indicated by lines 41 in about a −45° relationship relative to the longitudinal axis 44A and by lines 43 in about a +45° relationship relative to the longitudinal axis. The composite fibers 41 are constituted, for example, graphite with epoxies, polycyanates and thermoplastics. The fibers 41 are bound to the ceramic 16. These composite fibers 41, give the piezoelectric element the ability to induce strain in the foundation member axially, in bending and in torsion.

Figure 5A:
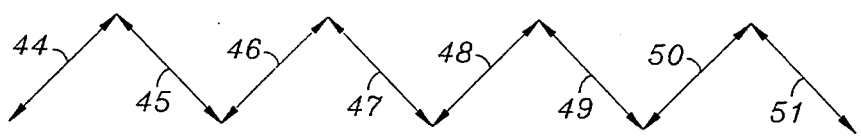
FIG. 5A is a vector-type diagram showing the preferred movement of each segment.

By having this arrangement, a preferred movement is developed for the set of piezoelectric elements 33 through 40. As illustrated in FIG. 5A the preferred movement for each respective element 33 to 40 is indicated by the lines 44, 45, 46, 47, 48, 49, 50 and 51. As can be seen, for instance, with regard to element 33 where the plies are arranged at about −45°, the preferred movement is directed at about +45° relatively. In other words, it is right angularly relative to the orientation of the plies. For an element 34, where the plies are orientated at about +45°, the preferred movement is right angularly directed at about −45°.

Figure 5B:
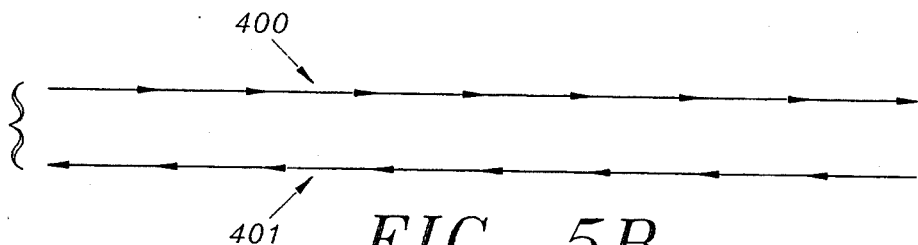
FIG. 5B is a diagram showing net movement of each segment developing overall movement in a torsional sense.

Considering the combination of piezoelectric elements 33 through 40, a net overall movement is depicted wherein the upper portion of the elements 33 to 40, collectively, are cumulatively urged in a rightward direction 400 as depicted in FIG. 5b and the lower portion of the elements are directed leftwardly as depicted in the lower line 401 of FIG. 5b.

Figure 6A:
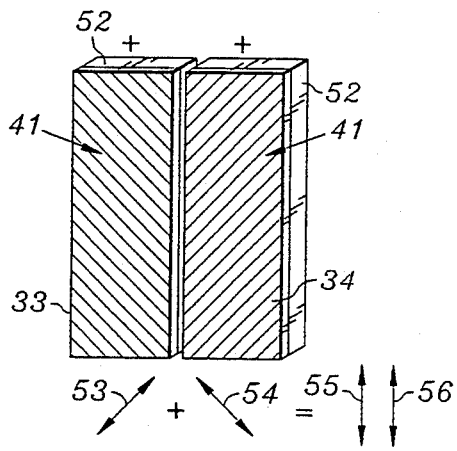
FIG. 6A is an isometric view illustrating the adjacent relationship of a set of two adjacent piezoelectric elements in a mode showing axial movement, the adjacent elements being poled in the same direction.
Figure 6B:
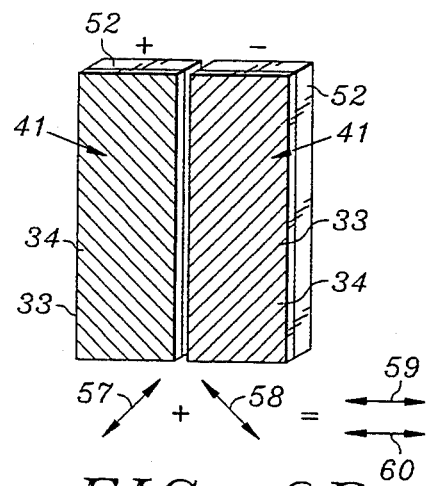
FIG. 6B is an isometric view illustrating the set of two adjacent piezoelectric elements under torsional motion, the adjacent elements being oppositely poled.

The minimum working actuator or sensor sets includes at least two adjacent piezoelectric elements as depicted in FIGS. 6A and 6B. In these FIGS. 6A and 6B, a 3-dimensional representation of the piezoelectric element is shown wherein the piezoelectric elements 33 and 34 are shown. Components 16 have a composite fiber 41 located on their reactive faces 23.

A positive voltage is applied in the poling direction as illustrated in FIG. 6A, namely there is a positive voltage on the face 23 of the piezoelectric element 33 which interfaces with the plies 41, and a negative voltage on the underside 52 of the piezoelectric element 33. As a result, the movement characteristics of element 33 is one where an expansive movement is preferred as indicated by a movement vector 53. Similarly, for piezoelectric element 34, an expansive movement as indicated by arrow 54 is preferred. These two motions as indicated by vectors 53 and 54 are additive in the axial direction as indicated by vector 55 and vector 56. The lateral transverse movement of each is relatively restricted. There is a canceling of the transverse forces emanating from movement vectors 53 and 54 and the overall movement of the set of elements 33 and 34 is therefore axially, namely in line with the longitudinal axis 44A.

In the relationship set out in FIG. 6B, the direction of poling for element 33 is the same as in FIG. 6A. Conversely, the direction of poling for element 34 is opposite in FIG. 6B relative to that in FIG. 6A. Thus, the face 52 would have a positive voltage whereas the top interface of element 34 would be a negative voltage. The polarity signs associated with the FIGS. 6A and 6B illustrate the poling directions.

In FIG. 6B, the net movement of element 33 is depicted by the vector arrows 57. This is the same as depicted by arrows 53 in FIG. 6A. The effect of the change of polarity on element 34 is that there is a contraction effect indicated by arrows 58 which are inwardly directed. The net result is that the longitudinal or axial strain effected by the set 33 and 34 as depicted in FIG. 6B cancel each other out. The net motion is a transverse lateral action as depicted by arrows 59 and 60. Arrows 59 and 60 are oppositely directed and thus, in the set 33 and 34 as set up in the illustration of FIG. 6B, a net torsional strain is applied to the configuration of the actuator set.

A tubular configuration with an actuator or sensor relationship with four sets, namely having eight actuators, is shown in FIGS. 3 and 4. This permits for a finely tuned control of an activated tubular structure. As shown in FIG. 7, different polarity combinations can produce independent axial, bending and torsional motion. Moreover, more than one motion can be accomplished or controlled concurrently by adding linear combinations having independent voltage sets. The actuators 1 through 8 are indicated along the top line of the table of FIG. 7; different poling situations are applicable as indicated along the lefthand side for situations 1 through 8.

In Case 1, for instance, the polarity of the voltage is the same for all the eight actuators. In this sense, the interface between the element and the composite is positive and the opposite face is negative. There can be axial extension of the elements and the foundation members on which the elements are mounted.

A reversal of all the polarities of all of the eight actuators causes axial compression of the elements and the foundation member as illustrated in Case 2.

In Case 3, the elements 1 and 2 of a set are established with a positive direction as in Case 1. Elements 5 and 6 are similarly poled. There is no poling applied to elements 3, 4, 7 and 8. A bending in a first direction is possible.

Switching the polarities for actuators 1, 2, 5 and 6 as indicated in Case 4, gives a bending in an opposite sense.

For Case 5, actuators 3, 4, 7 and 8 are subjected to poling voltages and actuators 1, 2, 5 and 6 are not subjected to poling voltages, and bending in a right angular relationship is effected. Thus, in Case 5, actuators 3 and 4 are set up with a poling relationship as illustrated in FIG. 6A. Actuators 7 and 8 are set up in the reverse poling relationship to that of FIG. 6A.

In Case 6, the reverse situation is established.

In Case 7, there is a relationship where every alternate actuator 1 through 8 is oppositely poled, with a relationship where actuators 1 and 2 are set up as per FIG. 6B. This is then repeated in pairs up to FIG. 8. A torsional effect is created in the first direction in this situation.

In Case 8, the polarities of each of the elements of the set are switched and a torsion effect in an opposite sense is created.

Actuators and Sensors

The system can operate with flow between four sensors and four actuators, namely having four piezoelectric elements acting as actuators and four piezoelectric elements acting as sensors. The cooperative operation between respective sensors and actuators would achieve control in two bending senses, an axial sense, and a torsion sense. As illustrated in FIGS. 8A, 8B, and 8C, the four sensors 100, 101, 102 and 103 are set up in relation to four actuators 104, 105, 106 and 107. The sensors are established in relation to an X axis which could be an axial longitudinal axis, and the Y axis which is the transverse lateral axis, and are on two perpendicular planes, both parallel to the longitudinal axis. The related actuator and sensor can be located adjacent each other on a foundation member, or alternatively over each other in a sandwich type configuration.

Controllers

The four sensors 100, 101, 102 and 103 and the four actuators 104, 105, 106 and 107 are controlled by four electronic controller units 108, 109, 110 and 111.

In FIGS. 8A and 8B, controller 108 regulates an axial movement, the controller 109 is a bending controller, and controller 110 controls a bending moment. Controller 111 is a torsional controller. The interaction of the sensors 100 through 103 with controllers 108 to 111 are indicated by lines generally indicated as 112. The actuators 104 through 107 are associated with controllers 108 through 111 by lines 113 which are generally shown.

In FIG. 8A, there is depicted a general type of controller for the sensor-actuator system which can separate the system into component axes. Between the sensors 100 to 103 and controllers 108 to 111, there are weighted gain elements 300 at the input and between the controllers 108 to 111 and the actuators 104 to 107, there are weighted outputs 301 whose outputs are summed in summation elements 302. Such a configuration would be used particularly on an irregularly shaped foundation means such as an arbitrarily shaped tube, or a disk head drive support.

In the arrangement illustrated in FIG. 8B, the controller arrangement is useful for four sensors 100 to 103 and for four actuators 104 to 107 for use on the symmetrical tube. In such a situation, two of the sensors, namely sensors 101 and 102 are used for bending moment and only polarity elements 303 and 304 are needed for the gain elements. The actual controller 108 has positive gain elements 303 and 304 from all of the sensors 101 and 103 and directed to all of the actuators 104 and 107. The bending controllers are connected between each of two sensors and each of two actuators as indicated. The torsional controller 111 is the subject of signals from the four sensors 100 to 103.

In the configuration illustrated in FIG. 8C, informational flow is an arrangement where each of the controllers 108 through 111 control flow between a dedicated sensor 100 to 103 respectively to dedicated actuator 104 to 107. Each controller 108 to 111 is a multi-axis type controller for processing information for axial bending and torsional movement. Such an arrangement avoids gain means and averaging circuitry.

Foundation Member

FIG. 9 illustrates a half-sectional view of a 4-sided tubular structure in which different layers of a composite are developed to form the foundation member 11. The piezoelectric sensors 100 through 103 are located on the inside of a first layer 114 of a composite material forming the structure. The sensors are bonded to the inside of the tube after curing of the tube. The layer 114 is formed with plies at 60° relative to the longitudinal axis 115A, which is at right angles to the page. The next layer is formed by axial (0°) plies. This decreases the flexibility to lower frequencies. This layer 115 is illustrated as a second internal layer. The next layer 116 is formed of a combination of axial plies. The actuators 104, 105, 106 and 107 are embedded in this layer. The following layer 117 is an axial ply layer and the final layer 118 is arranged with a 60° relationship relative to the axis 115A.

The composite fibers used to form the foundation member 11 exhibits high modulus, strength and conductivity. The materials can be hardened against lasers and X-ray threats. The high modulus can have a pitch-100 which has up to 12 times the specific strength of aluminum. The fibers are relatively light-weight and provide a high stiffness, and high thermal and electrical conductivity. Different structure constructions are disclosed, for example, in U.S. Pat. No. 5,030,490 of Bronowicki et al., the contents of which is incorporated by reference herein.

The plies of the foundation member 11 are built up into at least 3 distinct stages, an internal structural layer 114, actuation layer 215, 116 and 117, and an external structural set 118. The make-up and orientation of the plies are based on a criteria of obtaining a balanced layer to reduce local bending deformation. Additional hoop plies (90°), namely to the the axis 115A, can be provided in the area of the actuator to increase the axial actuation through a Poisson's Ratio effect.

Special precautions assure the integrity of the piezoelectric element and minimize residual stresses when the piezoelectric elements are embedded in the foundation member 11. A technique for embedding the ceramic component 16 in the composite structure is further described in U.S. patent application Ser. No. 07/604,306 filed on Oct. 29, 1990 entitled "Encapsulating Ceramic Device and Method for Embedding in Composite Structures" by G. R. Dvorsky and D. W. Love. The contents of that application are incorporated by reference herein.

The relationship of the plies forming the foundation member 11 as illustrated in FIG. 9 is not shown with a ply thickness which is to scale, and the bottom half of the structure is similar to that which is shown in the top as indicated by the broken line 120. Thus, the sensor 103 and actuator 107 are not illustrated in FIG. 9.

The sensors 100 through 103 and actuators 104 through 107 contain both the piezoelectric components 16 and the composite fiber 41 bonded to the face orientated at the 45° to achieve the torsional actuation of the foundation member 11. In some situations, the angular relationship could be different to about 45°. In different situations, as long as the angular relationship of at least one of the actuators 100 to 103 and sensors 104 to 107 is offset relative to the other actuators, then an effective torsional relationship is obtained.

In different cases, the orientation of the plies 42 and 43 needs to be at an angle other than parallel to the longitudinal axis 44A or transverse the longitudinal axis 44A. Thus, the angle should be greater than 0° and less than 90° relative to the longitudinal axis 44A (115 in FIG. 9) in order to generate a torsional effect under appropriate poling conditions of one or more of the actuators 104 through 107 as illustrated in FIGS. 8A, 8B, 8C and 9.

In the arrangement illustrated in FIG. 9, the pairs of actuators are illustrated by 104 and 105 on the one hand, and 106 and 107, respectively. Similarly, the pairs of sensors can be 100 and 101 on the one hand, and 102 and 103 on the other hand. Thus, as illustrated in FIGS. 8 and 9, the four actuators and four sensors are sufficient to control the torsional strain.

Four-Sided Foundation Member with Actuators

As illustrated in FIG. 10, there is a 4-sided foundation member 11 with sides 200, 201, 202, and 203. The axial relationship is set up by the representative axes X, Y and Z illustratively shown within the strut. There are four actuators 204, 205, 206 and 207 shown on the respective walls 200, 201, 202 and 203 of the strut 11. Linearly spaced on the longitudinal axis are further actuators 208 and 209 shown in the drawings and similar actuators on walls 202 and 203 but not visible in the drawing.

The actuators 204 and 208 have plies 210 with an orientation of about −45° relative to the longitudinal axis 211 for the strut 11. The actuators 205 and 209 on the wall 201 have plies 212 on the respective actuators, the plies being orientated at about +45° relative to the axis 211. Arrows A for each of the actuators represent the actuation direction for each of the actuators. Similar actuation effects are created on walls 202 and 203 by actuators 206 and 207 and the other linear actuators established on these walls. Thus, for instance, with actuators 110, the effect of providing a poling voltage on Side A as a positive voltage would cause the expansion in the direction A. The application of a negative voltage would cause a contraction in direction A.

The following table indicates the motion sensors which result from activation of the activators illustrated in FIG. 10.

| To Actuate | Voltage on Side | | | |
| --- | --- | --- | --- | --- |
| | A | B | C | D |
| Axial | + | + | + | + |
| Bending about Y | + | − | − | + |
| Bending about Z | + | + | − | − |
| Torsion | + | − | + | − |

Octagonal Foundation Member

A different representation is shown of an alternative foundation member configuration in FIG. 11. This is an octagonal section. The respective angular relationships X, Y and Z are shown in the center along a longitudinal axis. Other polygonal shapes such as a hexagon or pentagon could effectively be used to form the foundation member strut 11. Sensors and actuators can be placed on the walls of such a strut to effect motion in the axial, bending, torsional and shear senses.

Improved Control of Foundation Members

Foundation members with the actuators 104 to 107 and with sensors 100 to 103 can be activated to control accurately the axial, bending and torsional movement senses of the foundation member 11. This provides for precision control of movement and vibration of the foundation member 11 and component parts associated with it.

The ability to bond sensors and actuators containing piezoelectric components 16 in a foundation member in a manner to control axial, bending and torsional movement and shear movement provides markedly improved control characteristics of foundation members 11. Utilizing the anisotropic properties of composite layer 41 applied to the piezoelectric component 16 and embedding or attaching sensors or actuators formed from such piezoelectric components and which work in axial, bending and torsional senses simultaneously is a valuable advantage in activated structures. Undesirable mass and stiffness coupling is avoided.

The 2-component structure forming the piezoelectric element has unique characteristics. As applied in coupled sets of two or more units, desirable control characteristics are imparted to the foundation member 11 with which it is coupled. The properties of the foundation member 11 in the form of a tube which can be hollow or solid, regular or irregular, as a function of the characteristics imparted by the piezoelectric elements and suitably controlled by the electronics and computer, provides for precise control of bending, axial and torsional motions of the foundation member 11. Local axial/shear coupling is introduced systemically around the circumference of the strut. This would relate as a stiffness coupling in the shell forming the foundation member 11.

The piezoelectric wafers are laid with the foundation member with their lateral face having longitudinal and transverse directions substantially flat on the surface of the foundation member. The depth of the piezoelectric element is relatively narrow and extends in the poling direction, namely transversely relative to the longitudinal direction of the foundation member. The wafers can be adjacently located about the foundation member transversely relative to the longitudinal axis and linearly along the longitudinal axis. Thus, a flat, thin profile is provided. The effective bonding of the wafers into the foundation member permits for control of movement of the foundation member. Different techniques can be provided to insure that the piezoelectric elements are effectively bound to the foundation member to insure positive long-term control.

Different Aerospace Foundation Members

In the aerospace application of FIGS. 1A and 1B, the foundation member may be elongated substantially between a main body and a second body. Other applications exist where the foundation member is relatively short between two relatively fixed points. The foundation member may be shorter in length than its relative width or transverse size.

The foundation member itself may constitute on its side or end a mounting for operative elements whose shape it is desired to control. In this sense, the foundation member may be the base, for instance, of an optical mirror. By controlling the changes of shape of the piezoelectric elements along preferred motions and causing the relationship of different piezoelectric elements to be regulated, the axial, bending or torsional positions of the foundation member and hence, an optical mirror, may be altered effectively.

Disk Drive Head Foundation Member

As illustrated in FIG. 12A, there is a side view of a disk drive head. There is a pick-up head component 400 which is mounted at the end of a foundation arm 401. Foundation arm 401 includes a flat plate 402 and upstanding elements 403 and 404 which taper outwardly from the pick-up head 400. The arm 401 slopes upwardly from the head 400 which is horizontal and ends horizontally at 405 with a flat platform 406 having upstanding vertically directed sections 407 and 408. The top platform 406 is mounted for pivotal movement about a point 409 so that the head 400 can pivot as indicated by arrows 410 and 411.

As illustrated in FIG. 12E, there are four actuator-sensor elements 412, 413, 414, and 415 which are to be added to the support structure 401 as illustrated in FIG. 12F. The structure 412 lays against the wall 404 of the support structure 402 and structure 413 lays on the base 402. Similarly, the structure 414 lays against the wall 403 and the structure 415 lays against the base 402. The restriction plies have an orientation for each of the elements 412, 413, 414, and 415 as indicated by lines 416.

The actuator and sensor elements 412, 413, 414, and 415 can be arranged in a suitable manner and interface with controllers such as 108 through 111 to effect control movement of the support element 401.

The disk drive support 401 holds the pick-up head 400 close to a rapidly moving disk. Track-to-track movement is accomplished by quickly rotating the support structure 401 over the disk. Those movement rates are increased to increase information transfer rates, access time dominated by the settling time of the support structure 401 is increasingly important. By applying active control to the support 401, information transfer rates from the disk can be significantly increased.

The open channel type construction of element 402, 403, and 404 renders the structure 401 susceptible to torsional vibration. The control system for this irregular shape foundation member would be that illustrated in FIG. 8A since the four actuator-sensor elements 412, 413, 414, and 415 are different for axial, bending and torsional movement. As illustrated, the four actuator-sensor elements are each shown as a single strip along the length of the element 401 as indicated. More such strips or strips divided into two sections along the length can be provided to provide the suitable number of sensors and actuators for the drive head.

Electronic Controllers

The actuators 104 through 107 and sensors 100 through 103 can be controlled electronically as shown in FIG. 13. There can also be control under operation of a central computer. Processing of signals between the sensors along wires 215 and the actuators can thus be effected.

Referring to FIG. 14 main components of the electronic control system are a sensor buffer which receives signals from the sensors and is constituted by a charge amp or voltage follower 500. The output is directed to an analog compensator 501 or a digital compensator 502. Such analog or digital compensator is under control of an appropriate algorithm 503.

In the analog mode, the compensator includes a set of active or passive filters, amplifiers, summers in series or parallel to be used at correctly shaped compensator 501.

In the digital compensation mode, there is an analog-to-digital component and a micro processor base controlled to consider structural vibration and global control aspects, the output of which is directed to a digital-to-analog element and in turn to a smoothing filter. The output from the compensator 501 or 502, as the case may be, is directed to a high voltage power amplifier 504, which is suitably compensated for capacitive loads. The output from the amplifier 504 is directed to operate the actuators appropriately.

General

In some cases, the provision of piezoelectric elements with obliquely orientated composite fibers so as to enhance at an angle the preferred motion of the piezoelectric elements themselves, can provide useful motion control of the elements themselves in different desired motion senses.

The strains imparted transversely relative to the poling direction, when they are relatively unequal in the longitudinal direction relative to the transverse direction of the piezoelectric element, provide for novel applications of the piezoelectric element. Such a piezoelectric element, which has a preferred strain which is non-longitudinal or non-transverse relative to the longitudinal or transverse direction of the piezoelectric element, provides unique properties.

The piezoelectric elements may be set up with a foundation member so that some have preferential motion. Other piezoelectric elements may be isotropic, namely having an equal transverse and longitudinal response. The combinations of such anisotropic and isotropic components provide for unique movement and for vibrational control and actuation of the foundation member. This enhanced control of motive and/or vibrational senses is effected by relating piezoelectric elements in the foundation member in different transverse planes which are relatively angularly related, namely not co-planar relative to each other.

Actuators and sensors formed from piezoelectric ceramic component 16 and component 41 consume very little power and are extremely lightweight and have a broad temperature range. Torsional actuators built into a foundation member 11 permit for precision boom pointing and vibration suspension. The constraining layers constituting the foundation member 11 are not stiff in torsion due to their piece-wise construction during the layered formation of the composite foundation member. Thus, the constraining layers do not move strain energy away from the actuator regions. The foundation members 11 manufactured with piezoelectric elements integrated into the foundation member do not complicate the modes of the structure with bending torsion or with axial torsion coupling.

Applications of piezoelectric elements with these characteristics to foundation members 11 have application in aerospace and in other articulated foundation members. Where extreme precision is required in applications such as robotics, the provision of sensors and actuators with the foundation member can provide significant advantages.

Many other forms of the invention exist, each differing from others in matters of detail only. The invention is to be determined solely in terms of the following claims.

We claim:

1. A structure comprising:
   (a) a foundation member having a face with a longitudinal direction and a transverse direction;
   (b) at least two piezoelectric elements, each element including a piezoelectric component having a reactive face and a poling direction, and a second component including fibers, the fibers being bound to the reactive face and wherein the fibers of adjacent piezoelectric elements are directed in different relative directions whereby the respective adjacent elements are provided with different preferred directions of motion for each element the elements being bound to the face of the foundation member for force transmission between the foundation member and the elements,
   whereby excitation of the piezoelectric components in the respective poling directions is selectively effective for movement of the foundation member in at least three senses.

2. A structure as claimed in claim 1 including at least three piezoelectric elements, the elements being relatively spaced apart on the foundation means.

3. A structure as claimed in claim 1 including at least four piezoelectric elements, the elements being relatively spaced apart on the foundation means.

4. A structure as claimed in claim 1 wherein the piezoelectric elements are adjacently located in a transverse direction on the foundation member.

5. A structure as claimed in claim 1 wherein different movement senses include the longitudinal direction, transverse direction and a torsional direction relative to the longitudinal direction.

6. A structure as claimed in claim 1 wherein the different movement senses include at least an axial sense relative to the longitudinal direction, a bending sense relative to the transverse direction, and a torsional sense relative to the longitudinal direction.

7. A structure as claimed in claim 1 wherein the movement senses include at least an axial sense relative to the longitudinal direction, a bending sense relative to the transverse direction, and a shear sense.

8. A structure as claimed in claim 1 wherein the foundation member includes a surface which is directed in at least two transverse planes, the planes being relatively offset from each other.

9. A structure as claimed in claim 1 wherein the foundation member includes multiple transverse planes relatively offset from each other.

10. A structure as claimed in claim 1 wherein the foundation member includes a cylindrical surface about a longitudinal axis, the axis being parallel with the longitudinal direction of the face.

11. A structure as claimed in claim 1 wherein the foundation member is tubular about a longitudinal axis, the axis being parallel with the longitudinal direction of the face.

12. A structure as claimed in claim 1 wherein the foundation member face includes a regular cylindrical surface about a longitudinal axis, the axis being parallel with the longitudinal direction of the face.

13. A structure as claimed in claim 1 wherein the foundation member face includes an irregular tubular cylindrical surface about a longitudinal axis, the axis being parallel with the longitudinal direction of the face.

14. A structure as claimed in claim 1 wherein the foundation member face includes a cylindrical surface with polygonal transverse faces about a longitudinal axis, the axis being parallel with the longitudinal direction of the face.

15. A structure as claimed in claim 1 wherein the foundation member face includes at least four transverse faces about a longitudinal axis, the axis being parallel with the longitudinal direction of the face.

16. A structure comprising:
   (a) a foundation member having a face with a longitudinal direction and a transverse direction;
   (b) at least two piezoelectric elements bound to the foundation member for force transmission between the elements and the foundation member, each element having a poling direction, a longitudinal direction and a transverse direction;
   (c) reinforcing members bonded to at least one pair of the elements, each of the reinforcing members having a direction of high strain resistance and a direction of low strain resistance for each element, the directions of high strain resistance being inclined oppositely relative to the foundation axis; and
   (d) the reaction between the foundation member and the piezoelectric elements upon selective activation of the elements along the respective poling directions effects movement of the foundation member in at least three different senses.

17. A structure as claimed in claim 1 wherein for the two piezoelectric elements, the fibers are bound to the reactive face such that the preferred motions of the two elements are transversely directed relative to each other.

18. A structure as claimed in claim 1 wherein the fiber of at least one of the piezoelectric elements are directed at an angle of about +45° relative to the longitudinal direction of the piezoelectric element and the fibers of the adjacent piezoelectric element are directed at about −45° relative to the longitudinal direction of the piezoelectric element.

19. A structure as claimed in claim 1 wherein piezoelectric elements are located relatively adjacently with the foundation member and include different movement characteristics relative to each other, and are alternately spaced transversely about the foundation member.

20. A structure as claimed in claim 1 wherein the piezoelectric elements are selectively actuators and sensors of movement and including control means for interacting with the actuators and sensors.

21. A structure as claimed in claim 1 wherein at least one of the two piezoelectric elements exhibits movement growth per unit length in one direction that is different than a corresponding movement growth in a second direction in the reactive face.

22. A structure as claimed in claim 1 wherein the two piezoelectric elements are poled in opposite directions relatively across the poling direction thereby to relate a sense of torsional motion with the foundation member.

23. A structure as claimed in claim 1 including multiple piezoelectric elements located in a longitudinal direction on the foundation member and wherein the elements are substantially longitudinally aligned.

24. A structure comprising a tubular foundation member having longitudinal face portions in at least four transverse directions and having a depth and a longitudinal axis:
   (a) at least four piezoelectric elements bound to respective ones of the face portions for force transmission between the foundation member and the elements, each element including a piezoelectric component having a poling direction and a reactive face, there being elements located adjacently in a transverse direction relative to the foundation member, each of the adjacent piezoelectric elements including a fiber component bound to the reactive face of a piezoelectric component, the fiber components for adjacent piezoelectric elements being oriented alternately in different directions,
   whereby the force transmissions effect movement of the foundation member in a torsional sense relative to the longitudinal axis.

25. A structure as claimed in claim 24 including a control for selectively activating adjacent ones of the piezoelectric elements in alternate directions thereby to effect torsional movement of the foundation member.

26. A structure as claimed in claim 24 including a control for selectively activating adjacent piezoelectric elements in the same direction thereby to effect an axial movement in the longitudinal direction.

27. A structure as claimed in claim 24 including a control for selectively activating at least two elements located relatively transversely adjacent each other in the same polarity, and two elements located relatively opposite transverse each other in an opposite polarity thereby to effect a bending movement relative to the longitudinal axis on the foundation member.

28. A structure as claimed in claim 24 including means for controlling the actuation of the piezoelectric elements.

29. A structure as claimed in claim 24 including means for controlling the actuation of the piezoelectric elements.

30. A structure as claimed in claim 25 including means for controlling the actuation of the piezoelectric elements.

31. A structure as claimed in claim 26 including means for controlling the actuation of the piezoelectric elements.

32. A structure as claimed in claim 27 including means for controlling the actuation of the piezoelectric elements.

33. A structure as claimed in claim 27 including actuator and sensor piezoelectric elements.

34. A piezoelectric element comprising a first component including a reactive laterally directed face having a longitudinal direction and a transverse direction, and including a poling direction, a second component on the reactive face, the second component including fibers being directed at an angle between the longitudinal and transverse directions whereby a preferential motion is imparted to the reactive face in a plane defined by the reactive face relative to motion in the poling direction.

35. A piezoelectric element as claimed in claim 34 wherein the fibers are directed at about 45° relative the longitudinal direction and the transverse direction.

36. A piezoelectric element as claimed in claim 34 wherein the element is selectively an actuator or sensor element.

37. A pair of piezoelectric elements as claimed in claim 34 wherein the elements are intended for spaced adjacent relationship on a foundation member, one element of the pair being directed with the second component along a first direction relative to the foundation member and the second element of the pair being directed with the second component in a second direction relative to the foundation member.

38. A method of effecting movement of a structure comprising:
(a) forming a foundation member;
(b) bonding at least two piezoelectric elements with the foundation member for force transmission between the elements and the foundation member, the elements being adjacently located relative each other;
(c) bonding to a ceramic component of each piezoelectric element, a fiber component, and arranging the fibers of adjacent piezoelectric elements in different directions whereby the respective adjacent elements are provided with a different preferred direction of motion for each element, each of the elements being capable of activation thereby to transmit force between the foundation member and the piezoelectric elements in a longitudinal direction of the foundation member and in a transverse direction, the force transmitted in the transverse direction being differently related to the force transmitted in the longitudinal direction for each of the elements; and
(d) selectively activating the elements for effecting a reaction between the foundation member and the piezoelectric elements in at least three movement senses.

39. A method as claimed in claim 38 including locating at least three piezoelectric elements in adjacency on the foundation member.

40. A method as claimed in claim 38 including locating at least four piezoelectric elements in adjacency on the foundation member.

41. A method as claimed in claim 38 including spacing the piezoelectric elements transversely on the foundation member.

42. A method as claimed in claim 38 wherein the different movement senses includes at least a longitudinal direction, transverse direction and a torsional direction relative to a longitudinal axis of the foundation member.

43. A method as claimed in claim 38 wherein the movement senses includes at least an axial sense, a bending sense, and a shear sense relative to a longitudinal axis of the foundation member.

44. A method as claimed in claim 38 wherein the foundation member is formed with a face directed in at least two transverse planes relative to a longitudinal axis of the foundation member.

45. A method as claimed in claim 38 wherein the foundation member is formed at least partly as a cylindrical surface in a transverse direction relative to a longitudinal axis of the foundation member.

46. A method as claimed in claim 38 wherein the foundation member is tubular in a transverse direction relative to a longitudinal axis of the foundation member.

47. A method as claimed in claim 38 wherein the preferred directions of motion of two adjacent elements have transverse components directed oppositely relative to each other.

48. A method as claimed in claim 38 including directing the fibers of at least one of the piezoelectric elements at an angle of about $+45°$ relative to a longitudinal direction and the fibers of an adjacent piezoelectric element at about $-45°$ relative to a longitudinal direction.

49. A method as claimed in claim 38 including alternately spacing piezoelectric elements having different reactive faces transversely about the foundation member.

50. A method as claimed in claim 38 including controlling the piezoelectric elements to selectively effect activation and sensing of movement.

51. The structure of claim 16 wherein simultaneous activation of the elements in opposite polarities produces lateral movement of the foundation member.

52. The structure of claim 16 wherein simultaneous activation of the elements in the same polarity produces axial movement of the foundation member.

53. The structure of claim 16 wherein simultaneous activation of alternately adjacent ones of the elements with opposite polarity produces torsional movement of the foundation member.

54. The structure of claim 16 wherein simultaneous activation of a first pair of the elements with one polarity and a second pair of the elements with the opposite polarity produces bending of the foundation member in one plane along the foundation axis.

55. The structure of claim 54 wherein simultaneous activation of one member of each pair in with one polarity and the other member of each pair with the opposite polarity produces bending of the foundation member in a different plane along the foundation axis.

56. The structure of claim 55 wherein simultaneous activation of alternately adjacent ones of the elements with opposite polarity produces torsional movement of the foundation member.

57. The structure of claim 56 wherein simultaneous activation of the elements in the same polarity produces axial movement of the foundation member.

* * * * *